United States Patent
Thiessen et al.

[11] Patent Number: 6,163,162
[45] Date of Patent: Dec. 19, 2000

[54] TEMPERATURE COMPENSATED VERTICAL PIN PROBING DEVICE

[75] Inventors: William F. Thiessen, Newtown; Arthur Evans, New Milford, both of Conn.

[73] Assignee: Wentworth Laboratories, Inc., Brookfield, Conn.

[21] Appl. No.: 09/228,017

[22] Filed: Jan. 11, 1999

[51] Int. Cl.[7] .................................................. G01R 31/02
[52] U.S. Cl. ........................ 324/761; 324/754; 324/755
[58] Field of Search ..................................... 324/760, 761, 324/158.1, 754, 755

[56] References Cited

U.S. PATENT DOCUMENTS

| | | | |
|---|---|---|---|
| 4,027,935 | 6/1977 | Byrnes et al. | 339/48 |
| 5,670,889 | 9/1997 | Okubo et al. | 324/760 |
| 5,952,843 | 9/1999 | Vinh | 324/761 |
| 6,005,401 | 12/1999 | Nakata et al. | 324/754 |

OTHER PUBLICATIONS

IBM, C4 Product Design Manual vol. 1: Chip and Wafer Design Chapter 9, Wafer Probing Manual distributed to Sematech, MCNC at seminars in 1993 and 1994.

*Primary Examiner*—Safet Metjahic
*Assistant Examiner*—Jimmy Nguyen
*Attorney, Agent, or Firm*—William C. Crutcher

[57] ABSTRACT

An improved vertical pin probing device is constructed with a housing spaced upper and lower dies of Invar®, which substantially matches the coefficient of thermal expansion of the silicon wafer being probed. Spaced slots in the top and bottom dies of the housing contain inserts of Vespel®. The inserts are provided with matching patterns of holes supporting probe pins and insulating the probe pins from the housing.

7 Claims, 2 Drawing Sheets

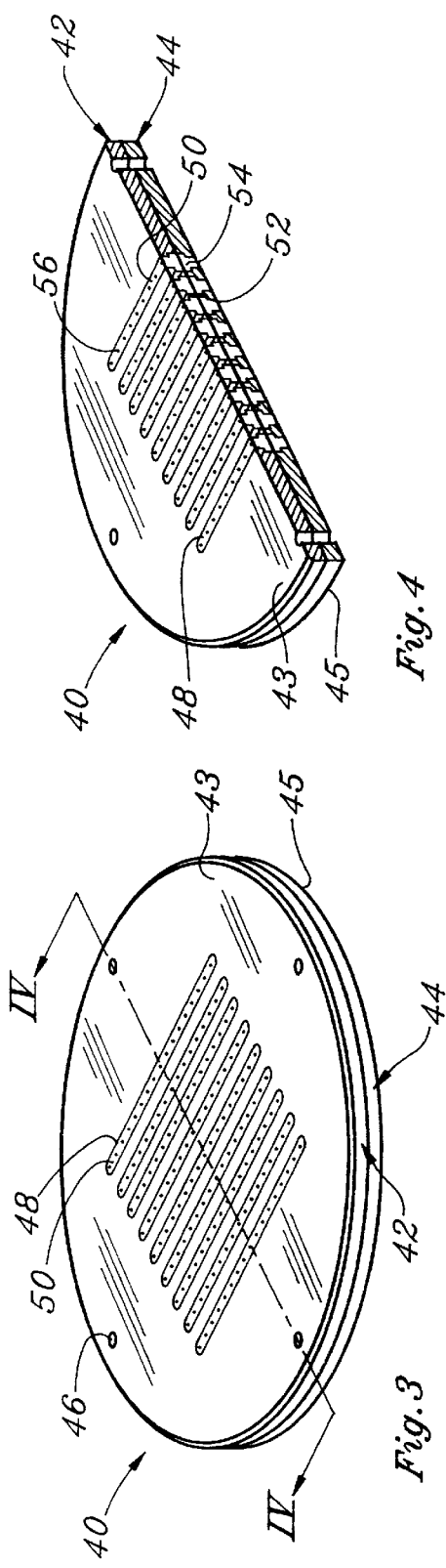
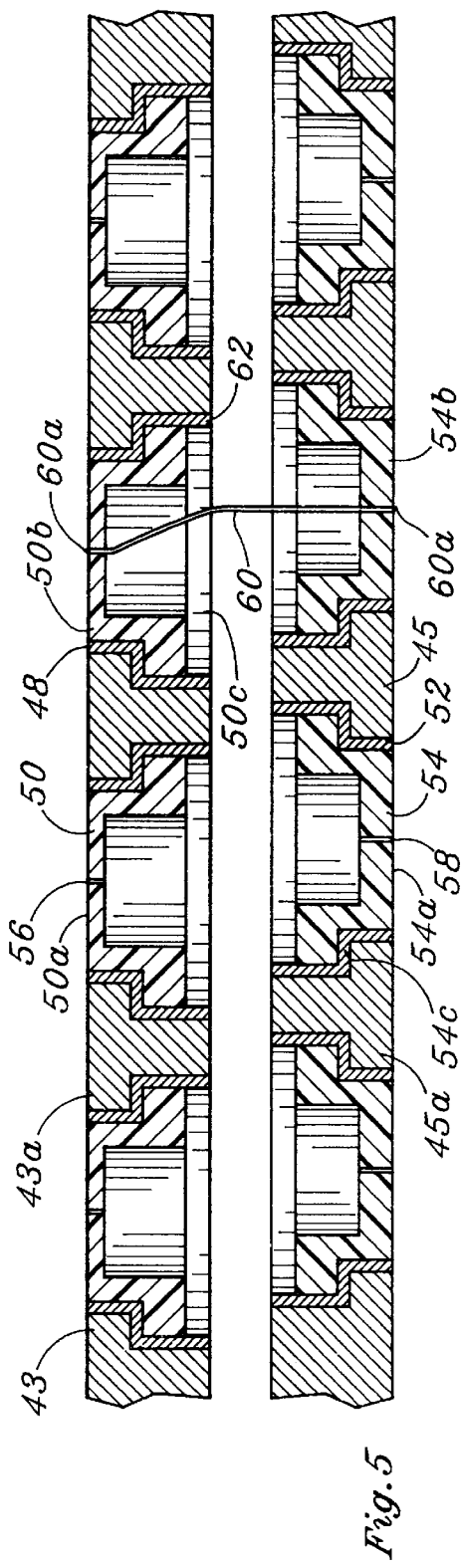
Fig.3
Fig.4
Fig.5

TEMPERATURE COMPENSATED VERTICAL PIN PROBING DEVICE

This invention relates to an improved temperature compensated vertical pin probing device for probing integrated circuits over a large temperature range.

BACKGROUND OF THE INVENTION

Integrated circuits in their wafer state are tested using probing devices, the probes of which are traditionally of cantilevered or vertical configuration. In a known type of vertical pin probing device, the probes are held between spaced upper and lower dies and are generally curved with a straight portion that protrudes substantially perpendicular to the lower die of the housing. As the wafer under test is raised into contact with the probing device, and then overdriven a few thousandths of an inch, the probes recede into the housing, and the curved portion of the probe deflects causing spring force that provides good electrical contact with the integrated circuit pads.

Traditionally, the housing is made from a dielectric material, often a plastic such as Delrin®, trademark of E. I. duPont de Nemours & Co.

When a certain IC (integrated circuit) is tested at two or more temperatures, over a large temperature range, for example 32 degrees F., room temperature, and 275 degrees F., the typical prior art probe housing expands with a significantly higher thermal expansion rate than that of the silicon base material of the IC wafer under test. Such expansion causes a mismatch of the probe locations and the IC pad locations, a condition that not only results in failure to make satisfactory electrical contact, but may result in fatal damage to the IC due to probe penetration in the circuit region of the IC.

One solution to this problem is to dimensionally compensate the room temperature pitch dimensions of probes in the housing so that at the specified test temperature it will have expanded to provide a nearly exact match of probe and pad positions. Except for temperatures within a narrow range, this option requires separate probe devices for each specific temperature, thus greatly increasing the user's monetary investment in probe devices.

Another solution would be to find a plastic or other suitable dielectric that matches the coefficient of thermal expansion of the silicon wafer. To date, however, the most practical choices of dielectric materials have expansion rates much higher than silicon.

One disadvantage of a plastic housing is that of electrical impedance characteristics. The tester and the probe device, which is generally mounted on a round printed circuit board, are designed to provide a certain characteristic impedance—usually 50 ohms. Such a design typically employs a ground plane or concentric metallic shield in relation to the conductor. The surface areas of the two conductors, the distance by which they are separated, and the dielectric constant of the dielectric material between the conductors determines the impedance. The plastic housing introduces a discontinuity in the desired characteristic impedance.

Another disadvantage of a plastic housing is that most plastics have a limited high temperature capability, preventing their use for vertical pin probing devices used to probe ICs at very high temperatures.

Accordingly, one object of the present invention is to provide a temperature compensated vertical pin probing device for probing integrated circuits over a large temperature range.

Another object of the invention is to provide an improved vertical pin probing device providing an improved electrical impedance match to the typical 50 ohm system impedance.

Still another object of the invention is to provide an improved vertical pin probing device suitable for probing integrated circuits at very high temperatures.

SUMMARY OF THE INVENTION

Briefly stated, the invention comprises an improved temperature compensated vertical pin probing device for probing integrated circuits over a large temperature range, the integrated circuits having spaced contact pads on a circuit substrate to be contacted by probe pins for testing, the probing device being of a known type comprising upper and lower spaced die members respectively defining upper and lower patterns of holes therethrough corresponding to the integrated circuit contact pad spacing at a preselected temperature, and a plurality of probe pins, each pin being disposed in a pair of upper and lower holes and extending beyond the lower die to terminate in a probe tip, the improvement comprising a die member having a die substrate with a coefficient of thermal expansion substantially matching that of the circuit substrate, said die substrate defining a plurality of apertures therethough having aperture sidewalls, a plurality of inserts of insulating material disposed in said apertures and having insert sidewalls, and an adhesive securing the insert sidewalls to the recess sidewalls, said insert defining a plurality of holes therethrough forming part of a said pattern of holes. In its preferred form the die substrate is of Invar metal alloy and the insert is of Vespel resin or Macor ceramic.

DRAWING

The subject matter, which is regarded as the invention, is particularly pointed out and distinctly claimed in the concluding portion of the specification. The invention, however, both as to organization and method of practice, together with further objects and advantages thereof, may best be understood by reference to the following description, taken in connection with the accompanying drawings, in which:

FIG. 1 is an elevational drawing in cross section showing a prior art vertical pin probing device, together with portions of a printed circuit test board and wired interface and portions of a silicon wafer and chuck support, FIG. 2 is an enlarged side elevational view in cross section showing details of the FIG. 1 prior art vertical pin probing device construction for two probe pins, FIG. 3 is a perspective view of the improved vertical pin probing device according to the present invention, FIG. 4 is a perspective view showing a cross section through the probing device, taken along lines A—A of FIG. 3, and FIG. 5 is an enlarged and exploded side elevational view in cross section illustrating portions of the probing device of FIGS. 3 and 4.

DETAILED DESCRIPTION OF THE DRAWINGS

Figure 1:
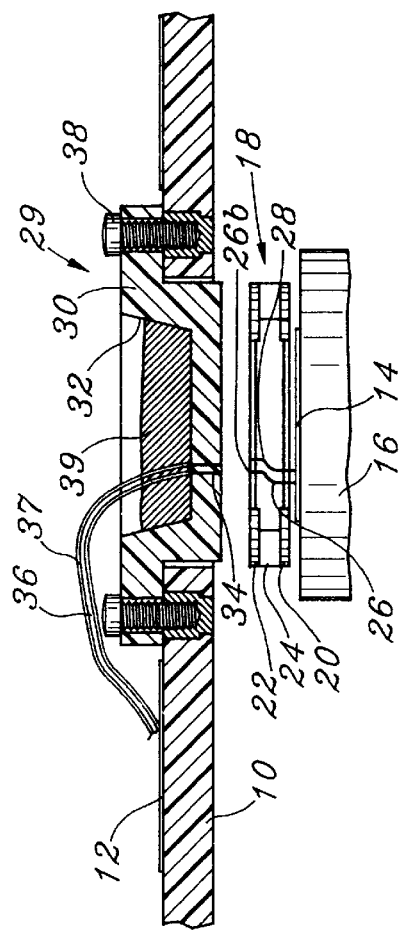
Figure 2:
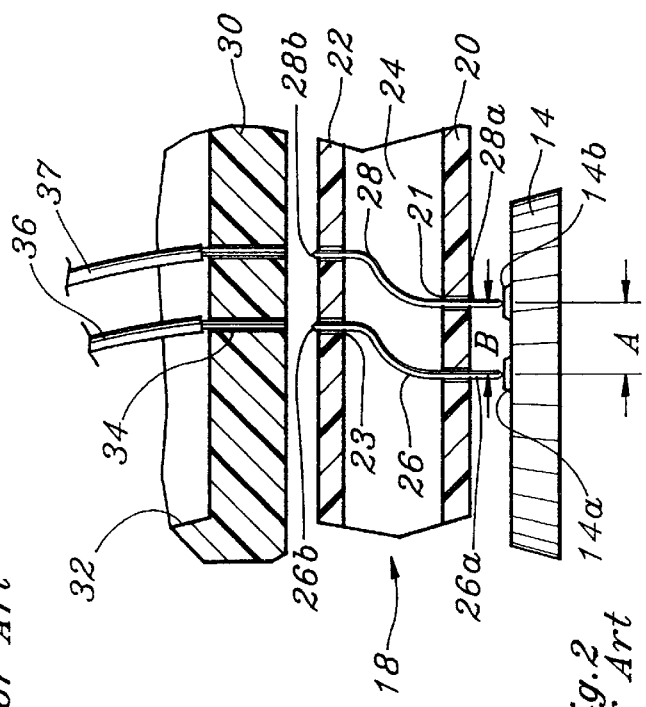

Before describing the improvements of the present invention, reference should be made to FIGS. 1 and 2 of the drawing illustrating a prior art vertical pin probing device used with an interconnecting device called a "space transformer" and a printed circuit board. The simplified view of FIG. 1 illustrates a prior art construction. A printed circuit test board 10 sometimes called a "probe card" includes conductive traces 12 which are connected in test circuit relationship to integrated circuit test equipment (not shown). In practice, the traces 12 lead to "pogo pads" on the printed circuit board, to which the external test equipment leads are connected in a prescribed test. An integrated circuit 14 or other device under test is supported on a movable chuck 16. Integrated circuit 14 typically has a pattern or matrix of contact pads to be simultaneously probed by a vertical-pin integrated circuit probing device 18, such as the COBRA® probe head sold by Wentworth Laboratories. Probing device 18 includes a lower die 20 with a group of holes 21 and upper die 22 with a group of holes 23 separated by a spacer 24 and carrying multiple vertical pin probes 26, 28. The die materials are typically made of a plastic insulating material such as Delrin®, an acetal resin manufactured by E. I. duPont de Nemours & Co.

Reference to the enlarged cross-section view FIG. 2 illustrates that the two representative probes 26, 28 include probe tips 26a, 28a respectively protruding from holes 21 in the lower face of lower die 20 and exposed heads 26b, 28b respectively protruding from holes 23 in the upper side of upper die 22. The holes 21, 23 containing the opposite ends of the vertical probe pins 26, 28 are slightly offset from one another and the probe pins are curved in a snake-like configuration to promote buckling, so as to create substantially uniform contact pressure on the integrated circuit pads 14a, 14b despite any slight vertical unevenness or misalignment.

A prior art space transformer shown in FIG. 1 is indicated generally at 29 and comprises a mounting block 30 with a well 32 formed therein. At the bottom of the well, a number of holes 34 are laid out to dimensionally correspond to a first small inner pattern defined by the exposed heads 26b of the probe head assembly 18. The probing assembly 18 is shown separated from the space transformer 29 for clarity but is connected thereto in actual operation by screws (not shown).

An individual insulated wire 36 is connected to PCB trace 12 at one end and on the other end, the wire extends into a hole 34 in the mounting block 30 so as to be in electrical contact with probe head 26b on the underside of block 30 when the probe assembly 18 is bolted to the space transformer 29. A similar wire 37 cooperates with probe head 28b.

Space transformer 29 is attached to the PC board by means such as screws 38, and an epoxy potting compound 39 immobilizes wires 36, 37. The probing device 18 is attached to the underside of space transformer 29 by screws (not shown), so that probe heads 26b, 28b make electrical contact with leads 36, 37. The integrated circuit 14 has a number of spaced contact pads, such as 14a, 14b, spaced apart by dimension A. The probe tips 26a, 26b are spaced apart by dimension B. Prior art devices in which the coefficient of thermal expansion of the die material is substantially different from the coefficient of thermal expansion of the silicon wafer (0.00000156 inches per inch per degree F. or 0.0000028 meters per meter per degree Kelvin) will result in a mismatch between dimensions A and B to a degree which depends on the temperature range of probing.

Referring now to FIG. 3 of the drawing, the improved temperature compensated vertical pin probing device is indicated generally by reference numeral 40 as comprising an upper die member 42 and a lower die member 44. The dies are held together and mounted to the mounting block 30 shown in FIG. 1 by means of screws (not shown) passing through suitably placed holes 46 around the perimeter. Each of the upper and lower die members includes a plurality of spaced elongated apertures, such as 48, each aperture containing an insert such as 50. The upper and lower die members 42, 44 are fabricated from a substrate core material having a coefficient of thermal expansion as close as possible to that of the silicon making up the circuit substrate. One preferred material is a nickel metal alloy of Invar®, (registered trademark of Imphy S.A.) having a coefficient of thermal expansion of 0.00000100 inches per inch per degree F. (or 0.0000018 meters per meter per degree Kelvin) at a nominal composition of 36% nickel. The thermal coefficient of expansion may be varied so as to coincide exactly with that of silicon as desired by adjusting the percentage of nickel in the alloy as known in the art. (Sisco, *Modern Metallurgy for Engineers*, 2nd Edition p. 299).

Referring now to FIG. 4, a cross section along lines A—A of FIG. 3 shows the lower die to include similar recesses 52 containing inserts 54 disposed in opposed relationship to the aforementioned recesses 48 and inserts 50, but slightly offset from one another along the juncture between upper and lower die members. Each of the upper die members contains a plurality of holes 56 disposed in a preselected position as part of a larger pattern of holes in the upper die member 42. Similarly, each of the inserts 54 in the lower die member contains a similar plurality of holes 58 (see FIG. 5).

Reference now to the enlarged cross sectional view of FIG. 5 illustrates that inserts 50 and 54 are generally channel shaped members with center walls 50a, 54a respectively having holes 56, 58 respectively extending therethrough. Holes 56, 58 are spaced from one another in offset pairs by the respective sidewalls 50b and 54b respectively. The sidewalls 50b include projecting flanges 50c which mate with projecting flanges 43a in the sidewalls of the recess 48. Similarly, the sidewalls 54b of the lower inserts 54 include projecting flanges 54c which interlock with projecting flanges 45a in the recess sidewalls of recess 52. The inserts 50, 54 are retained in the recesses 48, 52 respectively by means of an adhesive 62 applied between the recess walls and the insert sidewalls. As previously known in the art, probe pins 60 extend between the spaced and offset holes 56, 58 in the upper and lower die members respectively. The upper ends of the probe pins 60 terminate in probe tips 60a which are disposed and make electrical contact with the wires such as 37 (FIG. 1) leading to the printed circuit test board. The lower ends of the probe pins 60 terminate in probe tips 60a which slide in holes 58 in known manner during probing of wafer 14 (FIG. 1).

The material of the inserts 50, 54 and the adhesive 62 are selected with respect to one another. One preferred insert is a synthetic resinous material sold under the trademark Vespel® manufactured by E. I. duPont de Nemours & Co., adhered within the die apertures by means of a heat-curable adhesive. The adhesive is cured at a temperature at the upper end of the anticipated temperature range over which the probing device is expected to function. By wholly or partially restraining the Vespel in an expanded state while curing the adhesive at the elevated temperature during assembly of the probe, one can take advantage of the elongation properties of the probe die material to substantially match the corresponding portions of the probes and the contact pads on the silicon wafer over a given range of test temperature. This is accomplished by drilling the holes 56, 58 in the insert material after cooling the assembly to room temperature. A suitable heat cured adhesive is Master Bond's Supreme 10HT.

MODIFICATION

A modified form of the invention employs a ceramic material for the inserts 50 and 54, together with a room temperature cured adhesive. A suitable ceramic material manufactured by Corning Glass Works is sold under the trademark Macor®, having a coefficient of thermal expansion of 0.0000052 inches per inch per degree F. (or 0.0000093 meters per meter per degree Kelvin). The Macor inserts may be coated with an anti-stick coating after the holes 56, 58 are drilled by laser or other mechanical means. A suitable anti-stick coating is XYLAN® manufactured by Whitford Corporation. A suitable room temperature cured adhesive for retaining the Macor inserts is Cotronics' Resbond EO45.

OPERATION

The operation of the invention may be described as follows. Since the Invar material has a coefficient of thermal expansion substantially matching that of the silicon, the Invar upper and lower dies expand substantially so as to dimensionally correspond to the expansion of the silicon wafer. Therefore the location of the centerlines of inserts 50, 54 and holes 56, 58 are located in accordance with the contact pads on the silicon wafer, and follow the expansion and contraction of the silicon wafer.

The inserts 50, 54 may expand and contract about their own centerlines with a higher coefficient of thermal expansion than the die members 43, 45. However, the inserts are restrained by the recess walls and only permitted to expand in a direction perpendicular to the plane of the wafer. Therefore, despite the fact that the coefficient of thermal expansion of the insulated inserts may be significantly different from that of the silicon wafer, it does not cause any significant mismatch between wafer contact pads and probe points over a large temperature range.

While there has been described what is considered to be the preferred embodiment of the invention and one modification thereof, other modifications will occur to those skilled in the art, and it is desired to secure in the appended claims all such modifications as fall within the true spirit and scope of the invention.

We claim:

1. An improved temperature compensated vertical pin probing device for probing integrated circuits over a large temperature range, the integrated circuits having spaced contact pads on a circuit substrate to be contacted by probe pins for testing, the probing device being of a known type comprising upper and lower spaced die members respectively defining upper and lower patterns of holes therethrough corresponding to the integrated circuit contact pad spacing at a preselected temperature, and a plurality of probe pins, each pin being disposed in a pair of upper and lower holes and extending beyond the lower die to terminate in a probe tip, the improvement comprising a die member having a die substrate with a coefficient of thermal expansion substantially matching that of the circuit substrate, said die substrate defining at least one aperture therethough having aperture sidewalls, at least one insert of insulating material disposed in said at least one aperture with a coefficient of thermal expansion greater than that of the circuit substrate and having insert sidewalls arranged to restrain the expansion of said insert in said aperture at elevated temperature, and an adhesive securing the insert sidewalls to the recess sidewalls, said insert defining a plurality of holes therethrough forming part of a said pattern of holes.

2. The improvement according to claim 1, wherein said die substrate is of Invar metal alloy.

3. The improvement according to claim 2, wherein said insert is of Vespel, the adhesive being of a heat curable type and in a cured state having been cured at the high end of said temperature range.

4. The improvement according to claim 2, wherein the insert is of Macor, the adhesive being in a cured state and having been cured at the low end of said temperature range.

5. The improvement according to claim 1, wherein said aperture sidewalls and said insert sidewalls each include projecting flanges which interlock to retain the inserts in the apertures.

6. The improvement according to claim 1, wherein there are a plurality of said apertures and a corresponding plurality of said inserts.

7. The improvement according to claim 1, wherein the insert is of ceramic material.

* * * * *